United States Patent
Nelson et al.

(10) Patent No.: US 6,720,828 B2
(45) Date of Patent: Apr. 13, 2004

(54) APPARATUS AND METHOD FOR COMPENSATING A HIGH IMPEDANCE ATTENUATOR

(75) Inventors: Theodore G. Nelson, Portland, OR (US); Michael P. Khaw, Portland, OR (US); Daniel G. Knierim, Beaverton, OR (US); John F. Stoops, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 09/992,058

(22) Filed: Nov. 21, 2001

(65) Prior Publication Data

US 2003/0102913 A1 Jun. 5, 2003

(51) Int. Cl.$^7$ ................................................. H03G 3/20
(52) U.S. Cl. ....................... 330/144; 330/284; 333/81 R
(58) Field of Search ............................ 330/76, 86, 126, 330/144, 284, 292, 11, 85; 333/81 R (56) References Cited

U.S. PATENT DOCUMENTS 4,507,618 A * 3/1985 Nelson ........................ 330/126
5,796,308 A * 8/1998 Link et al. .................. 330/284

* cited by examiner

Primary Examiner—Khanh Van Nguyen
(74) Attorney, Agent, or Firm—Thomas F. Lenihan; William K. Bucher (57) ABSTRACT

A high impedance attenuator for use in a test and measurement instrument employs compensation to adjust the low frequency attenuation to match the high frequency attenuation exhibited by the attenuator, rather than attempting to adjust the high frequency attenuation exhibited by the attenuator. In an alternate embodiment of the invention, compensation to adjust low frequency attenuation is employed in a feedback loop and an opposite compensation is applied in a parallel attenuation stage to stabilize the input resistance. In yet another embodiment of the invention, compensation to adjust low frequency attenuation is employed by means of an R-C time constant of an additional R-C circuit in a feed forward loop. This additional time constant is matched to the R-C time constant of the input R-C network. The input resistance of the attenuator is not changed.

5 Claims, 10 Drawing Sheets

APPARATUS AND METHOD FOR COMPENSATING A HIGH IMPEDANCE ATTENUATOR

FIELD OF THE INVENTION

The subject invention generally concerns the field of circuitry for compensating attenuators to correct for errors caused by stray capacitance, and specifically concerns novel architecture for such compensating circuitry.

BACKGROUND OF THE INVENTION

High impedance attenuators are commonly used in modern digital test equipment, such as oscilloscopes, digital multimeters, and the like, to greatly reduce undesirable interaction with (i.e., loading of) a circuit under test. Attenuators also serve to reduce large amplitude signals to prevent overloading of the input signal amplifier (i.e., front end) of the test and measurement instrument.

Typical high impedance attenuators for use with oscilloscopes exhibit a 10:1 attenuation of the input signal. Such attenuators normally employ a resistor-capacitor (R-C) voltage dividing arrangement and an amplifier. In such arrangements variation in the resistances is not a problem because highly accurate resistors are generally available. That is highly accurate DC attenuators are easily realized. However, variation in the capacitance values of the capacitors is much more of a problem. For this reason, those skilled in the attenuator art have traditionally chosen to adjust the capacitors, rather than adjust the resistors. High impedance attenuators are vulnerable to the effects of stray capacitance variation because the capacitors they use are small in value. Variations in circuit board traces of the attenuator, variations in the values of its components, and variations in its own input amplifier, all contribute to changes in high frequency attenuation. Unfortunately, these variations and variation in input capacitance values and stray capacitance adversely affect the operation of these attenuators by distorting the leading edges of signals under test.

Prior art attempts at correcting this problem have met with some success but have generally introduced problems of their own. For example, hand adjustment of variable capacitors is an unreliable procedure. One solution to this problem is to use electronically variable capacitors (varactor diodes), but unfortunately, varactor diodes are inherently non-linear. Other problems may further include the introduction of noise by variable gain amplifiers driving capacitive feedback, frequency-dependent problems, such as phase delay, or problems related to requiring a variable gain amplifier to absorb a significant portion of a high-frequency input current.

What is needed is a relatively inexpensive compensated attenuator circuit, for use in a test and measurement instrument, which does not exhibit, or which reduces the effects of, the undesirable traits listed above.

SUMMARY OF THE INVENTION

A high impedance attenuator for use in a test and measurement instrument employs compensation to adjust the low frequency attenuation to match the high frequency attenuation exhibited by the attenuator, rather than attempting to adjust the high frequency attenuation exhibited by the attenuator.

In an alternate embodiment of the invention, compensation to adjust low frequency attenuation is employed in a feedback loop and an opposite resistance is applied in an additional attenuator stage to stabilize the input resistance.

In yet another embodiment of the invention, compensation to adjust low frequency attenuation is employed by means of an R-C time constant of an additional R-C circuit in a feed forward loop. This additional time constant is matched to the R-C time constant of the input R-C network. The input resistance of the attenuator is not changed.

DETAILED DESCRIPTION OF THE DRAWING

Figure 1:
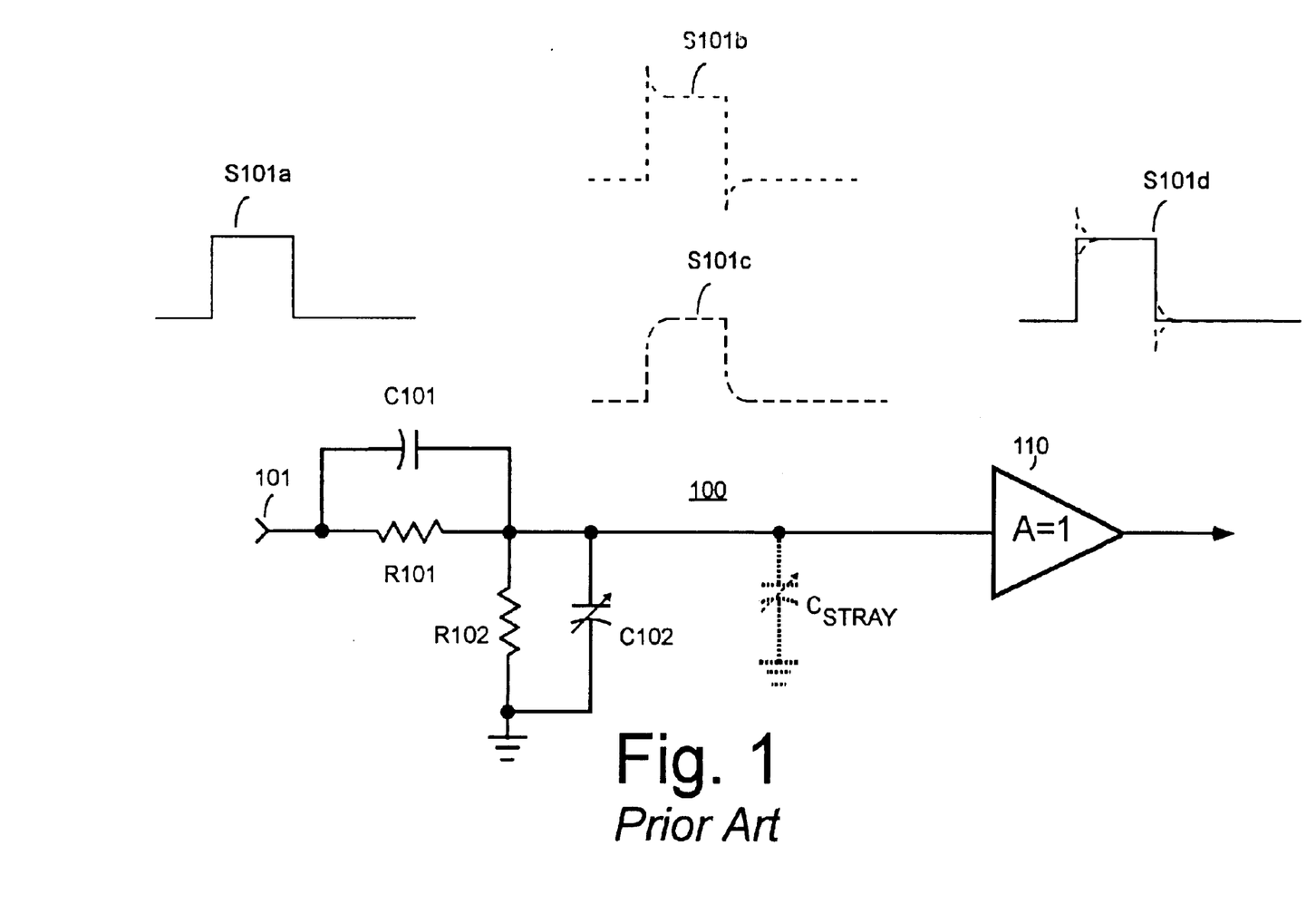
FIG. 1 shows an attenuator circuit having adjustable compensation, as known from the prior art.

FIG. 1 shows a prior art attenuator having adjustable compensation for stray part variations, and exhibiting a 10:1 divider ratio with respect to the amplitude of an input signal under test S101a. The circuit employs a resistive voltage divider arrangement consisting of resistors R101, R102, which are coupled in parallel with capacitors C101, C102, respectively. The attenuated output signal is developed across resistor R102 and applied to the input of a buffer amplifier 110. The nominal input capacitance of buffer amplifier 110 is included in C102. Typical values for the circuit components of FIG. 1 are:

R101=900 k$\Omega$
R102=100 k$\Omega$
C101=1 picofarad (pf)
C102=9 picofarad (pf) (variable)

Unfortunately, variations from the nominal capacitance of input amplifier 110, stray capacitance of circuit board traces, and tolerances of the components themselves, tend to distort the leading edges of an input waveform. These variations in capacitance are represented in FIG. 1 as a "ghost" capacitance $C_{STRAY}$ (shown in phantom), and as noted above, distort the signal under test. In this regard, waveforms S101b and S101c (both shown in phantom) are not separate signals, but are merely different examples of a distorted signal developed at the center tap of voltage divider R101, R102. For simplicity of explanation, the signal represented by waveforms 101b and 101c is shown as having the same amplitude as input signal 101a. However, one skilled in the art will quickly recognize that in actual practice, the amplitude of the signal developed at the junction of resistors R101 and R102 will be substantially one-tenth of the amplitude of input signal S101a.

In FIG. 1, the compensation adjustment may be done by laser-trimming of capacitor C102, or by using a variable capacitor, as shown. In either case, compensation is achieved when $R101 \times C101 = R102 \times (C102 + C_{STRAY})$. U.S. Pat. No. 4,507,618 (Nelson) issued Mar. 26, 1985 discusses adjusting the value of capacitor C101 or C102 to compensate for the above-mentioned distortion. If the value of capacitor C102 is too small with respect to the value of capacitor C101, then the low frequencies will be attenuated more than the high frequencies. This condition causes the signal developed at the center tap of voltage divider R101, R102 to have sharp edges as shown in waveform S101b. If the value of capacitor C102 is too large with respect to the value of capacitor C101, then the high frequencies will be attenuated more than the low frequencies. This condition causes the signal developed at the center tap of voltage divider R101, R102 to have rounded edges as shown in waveform S101c. The effect of changing the compensation by adjusting C102 is shown in output waveform S101d. Unfortunately, a variable capacitor is expensive, unreliable, and requires manual operation, and laser-trimming requires an extra manufacturing procedure. As noted above, the use of a varactor diode for capacitor C102 is undesirable because varactor diodes introduce non-linearity.

Figure 2:
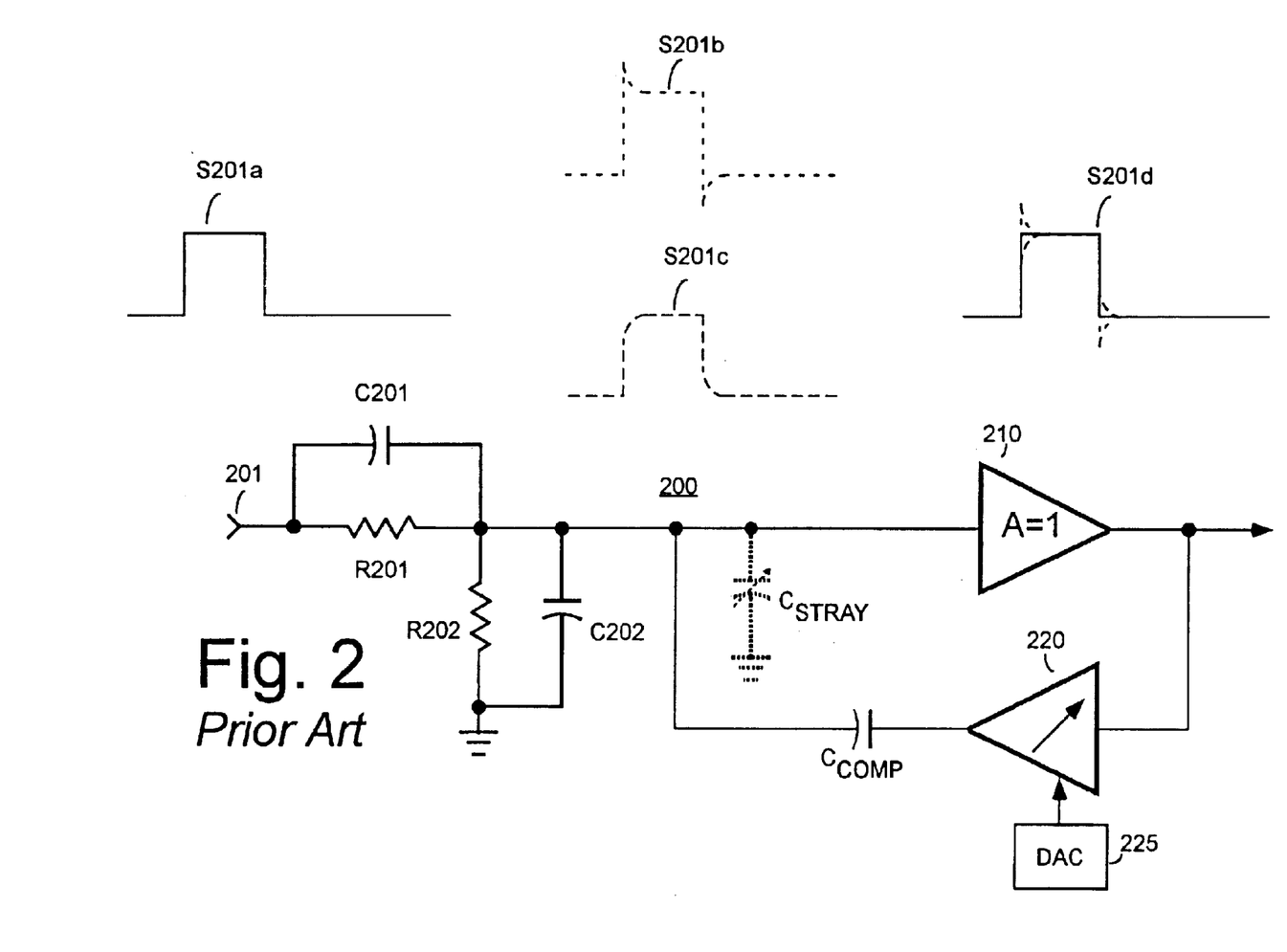
FIG. 2 shows another attenuator circuit having adjustable compensation, as known from the prior art.

FIG. 2 illustrates another prior art attempt at compensating an attenuator. Elements of FIG. 2 having similar reference numerals to elements of FIG. 1, serve a similar function, and need not be described in detail. FIG. 2 shows the addition of a feedback loop including a variable gain amplifier 220 operating under control of a controller represented as a Digital to Analog Converter (DAC) 225, and a coupling capacitor $C_{COMP}$. Changing the gain of amplifier 220 changes the value of the effective capacitance, $C_{EFF}$, loading the attenuator. If the gain of amplifier 220 is made equal to 0, then the value of $C_{EFF} = C_{COMP}$. If the gain of amplifier 220 is made equal to 1, then the value of $C_{EFF} = 0$. If the gain of amplifier 220 is made equal to $-1$, then the value of $C_{EFF} = 2 \, C_{COMP}$. In the arrangement of FIG. 2, the value of C202 is $9 \text{ pf} - C_{COMP}$.

The prior art circuit of FIG. 2 exhibits three problems. First, phase delays in the feedback loop of amplifiers 210 and 220 increase with increasing frequency, and become unacceptable at some high frequency. Second, variable gain amplifier 220 adds noise directly to the signal under test. Third, variable gain amplifier 220 provides compensation by acting as a current sink for high frequency components of the signal under test, and in this role it has to absorb a significant amount of high frequency current.

The subject invention will now be described with respect to embodiments shown in FIGS. 3, 4, and 5. In each of these three embodiments, compensation is achieved by adjusting the attenuation of the low frequency components of the signal, rather than by using the prior art method of adjusting the high frequency components.

Figure 3:
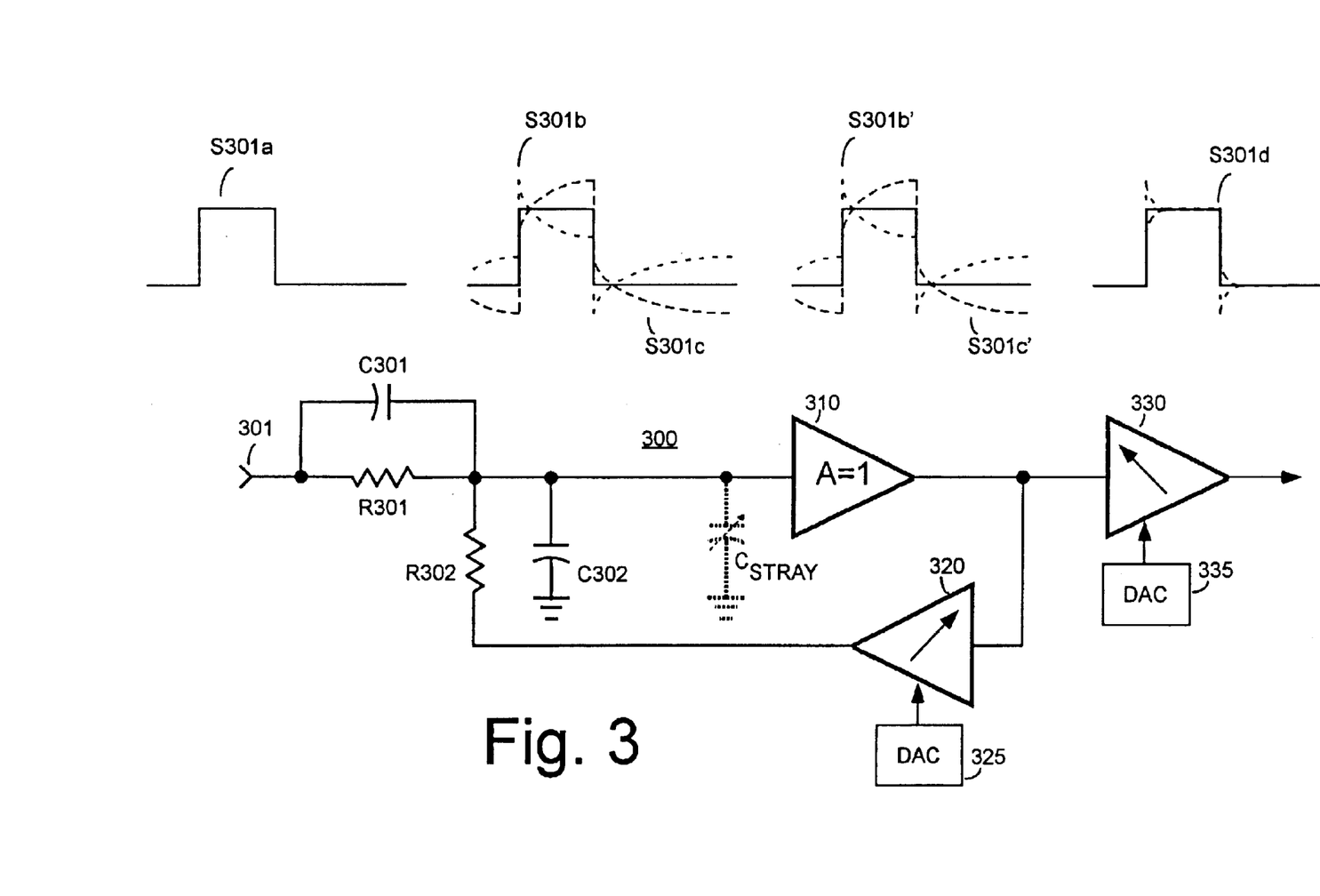
FIG. 3 shows an attenuator circuit having adjustable compensation in accordance with a first embodiment of the subject invention.

The circuitry of FIG. 3 employs low frequency feedback to achieve compensation, thus avoiding the phase delay problem of the prior art. It differs from the circuitry of FIG. 2 in that R302 is no longer coupled to ground. Instead, the output of a variable gain amplifier 320 serves as a point of signal return and is DC-coupled to the lower end of R302. This arrangement solves the noise problem, referred to above, in that the noise is improved because low frequency feedback is narrow band, typically <1 MHz bandwidth, and so only a small portion of the noise of amplifier 320 is fed into the signal path. It also solves the high frequency current problem because capacitor C302 returns to ground and because amplifier 320 does not act as a sink for high frequency components of the signal under test.

Waveform S301a represents the input signal under test. Waveforms S301b and S301c represent the range of adjustment available in a signal developed at the input of amplifier 310. Waveforms 301b' and 301c' represent the range of adjustment in the output signal developed at the output terminal of amplifier 310. Finally, waveform S301d shows the compensated signal developed at the output terminal of amplifier 330.

One skilled in the art will realize that amplifier 310 must have sufficient dynamic range to accommodate the capacitance variations. Moreover, this arrangement requires the use of a gain compensation stage 330, operating under control of a DAC 335. It is noted that the addition of gain compensation stage 330 is not burdensome because most modern oscilloscope designs already include such a stage. It is also noted that amplifier 330, and DAC 335 could be eliminated so long as their function is maintained by some other means. For example, the gain may be adjusted by digital multiplication (i.e., number crunching). A characteristic of the arrangement of FIG. 3 is that the input resistance changes with compensation adjustment. The input resistance is said to change because a portion of the compensation signal applied to the input terminal of amplifier 310 is also developed at input terminal 301, thereby affecting current flow into and out of input terminal 301. This characteristic is not considered to be unduly troublesome when the divider ratio is 10:1, because a 10% compensation range results in only a 1% change in input resistance.

Figure 4:
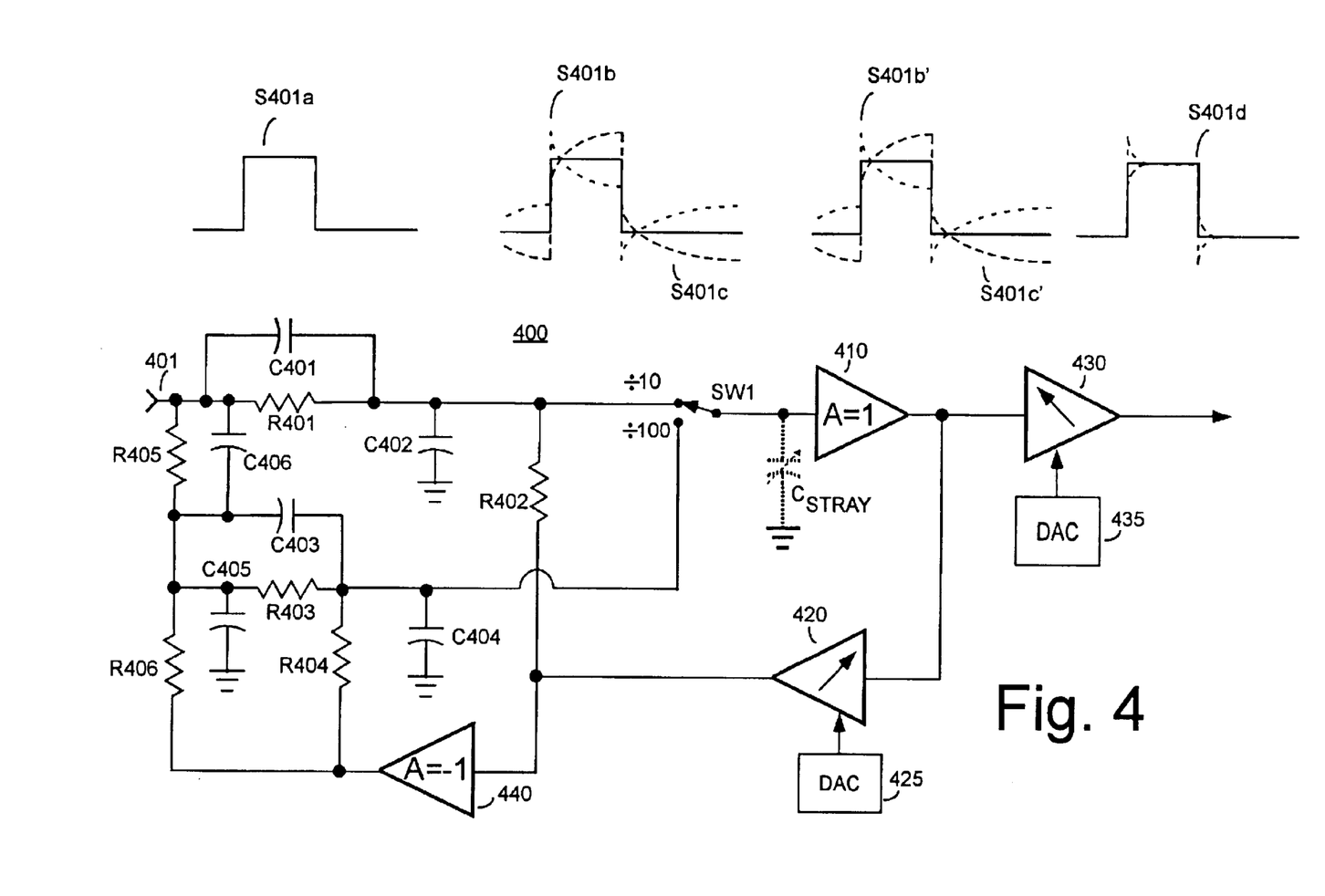
FIG. 4 shows an attenuator circuit having adjustable compensation in accordance with a second embodiment of the subject invention.
Figure 5:
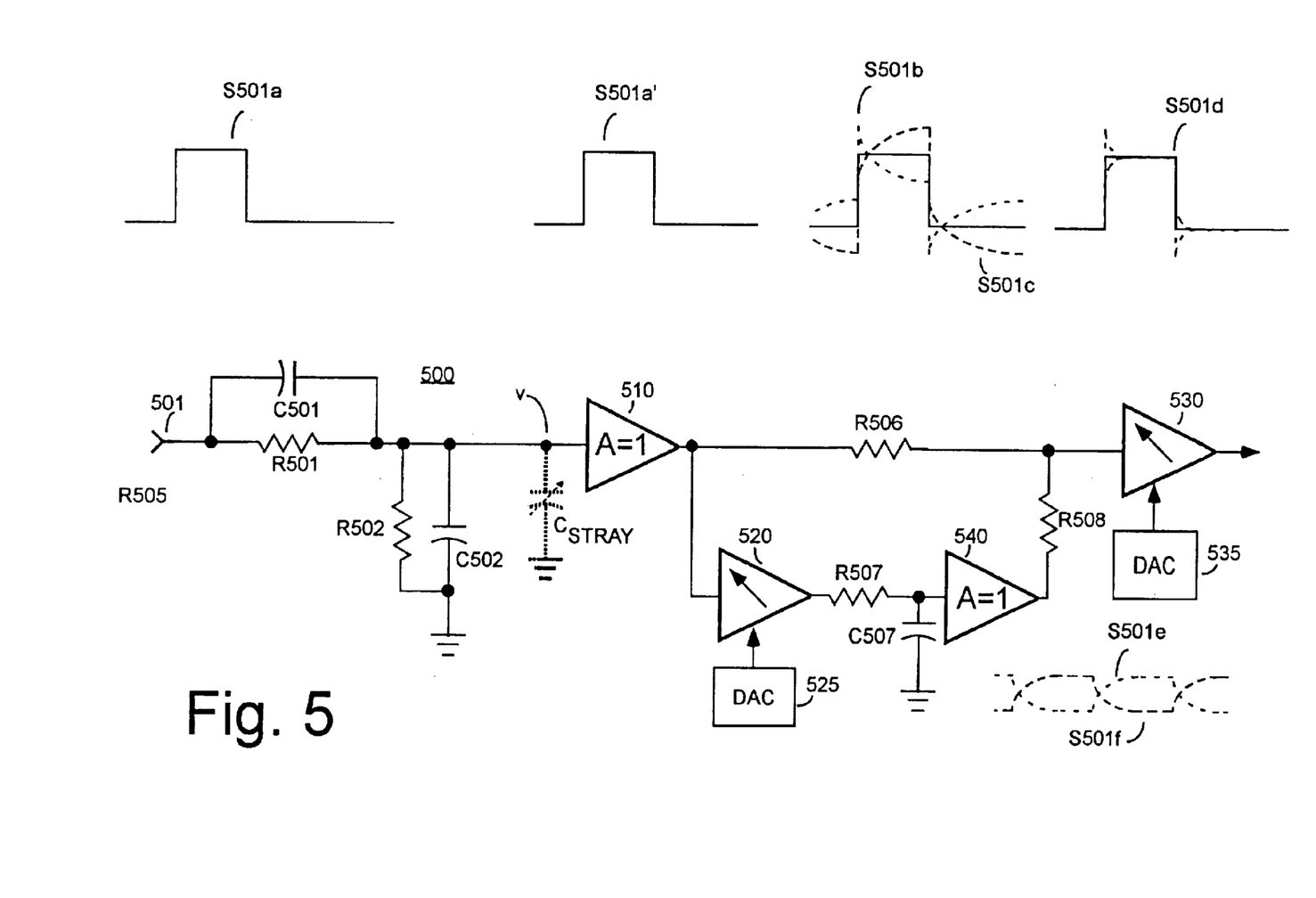
FIG. 5 shows an attenuator circuit having adjustable compensation in accordance with a third embodiment of the subject invention.

FIG. 4 is an illustration of circuitry employing a solution for the change of resistance effect. The circuitry of FIG. 4 takes advantage of a requirement of many attenuators to provide a second attenuation range, e.g., a selectable divide-by-100 stage, by applying an opposite resistance compensation in that stage.

Referring to FIG. 4, resistor R405 in series combination with resistor R406' forms a 10:1 resistive voltage divider (where R406 refers to the combination of R406 in shunt with the series combination of R403 and R404). Capacitor C406 in series with capacitor C405' forms a 10:1 capacitive divider in parallel with 10:1 resistive voltage divider (where C405 refers to the combination of C405 in shunt with the series combination of C403 and C404). A second 10:1 resistive-capacitive voltage divider, formed by the series combination of resistor R403 and resistor R404 in parallel with series combination of capacitor C403 and capacitor C404, is coupled to the center tap of voltage divider R405, R406'. This results In a cascade connection of two divide-by-10 arrangements for a total divider ratio of 100:1.

Switch SW1 selects between a divide-by-10 mode of operation and a divide-by-100 mode of operation. In divide-by-10 mode, the input signal resistive divider path comprises resistors R401 and R402. An output signal is taken from the center-tap of the divider (i.e., the junction of resistors R401 and R402). Low frequency compensation is applied at the bottom of the resistive divider (i.e., the second end of resistor R402). As noted above, a portion of the low frequency compensation signal is also felt at input 401. To compensate for the undesirable effects caused by the application of this signal at input terminal 401, an equal and opposite cancellation signal is applied to input terminal 401 via a second path comprising resistors R405 and R406'. Amplifier 440 has a gain of $-1$, and is employed to provide the above-mentioned opposite resistance compensation by applying the cancellation signal to the bottom of the second resistive divider. The two signals substantially cancel at input terminal 401. Thus, because current flow into and out of input terminal 401 is substantially unaffected, it follows that the input resistance seen at terminal 401 remains constant, independent of the compensation adjustment (i.e., the gain of amplifier 420).

When switch SW1 selects divide-by-100 mode, the input signal resistive divider path comprises resistors R405, R406, R403 and R404. An output signal is taken from the center-tap of the cascaded divider (i.e., the junction of resistors R403 and R404).

It should be noted that the value loaded into DAC 425 depends upon the position of switch SW1 for two reasons. First, the 10× and 100× attenuators may have different stray capacitance errors, and thus require different compensations. Second, The inversion provided by amplifier 440 will invert the polarity of the compensation. That is, a gain of amplifier 420 such that $G_{420}>0$ decreases attenuation of low frequency (LF) signals in the 10× attenuation path, but increases attenuation of the low frequency signals in the 100× path. One skilled in the art will realize that switch SW1 is preferably an electronic switch controlled by a controller (not shown) that also controls the value loaded into DAC 425.

As noted above, a portion of the low frequency compensation signal is also felt at input 401. To compensate for the undesirable effects caused by the application of this signal at input terminal 401, an equal and opposite cancellation signal is applied to input terminal 401 via the path comprising resistors R401 and R402. As noted above, because amplifier 440 has a gain of −1, the cancellation signal applied to the bottom of the first resistive divider (i.e., the bottom of resistor R402) is equal and opposite to the compensation signal. Once again, the two signals substantially cancel at input terminal 401. Thus, because current flow into and out of input terminal 401 is substantially unaffected, it follows that the input resistance seen at terminal 401 remains constant. In the circuitry of FIG. 4, input resistance is constant with any DAC setting but only the one attenuator currently in use is compensated.

Values for the elements of FIG. 4 are:

| | |
|---|---|
| R401 = 1.8 MΩ | C401 = 1 picofarad (pf) |
| R402 = 200 kΩ | C402 = 9 picofarads (pf) |
| R403 = 1.8 MΩ | C403 = 1 picofarad (pf) |
| R404 = 200 kΩ | C404 = 9 picofarads (pf) |
| R405 = 1.8 MΩ | C405 = 8.1 picofarads (pf) |
| R406 = 222 kΩ | C406 = 1 picofarad (pf) |

Although the circuitry of FIG. 5 also employs low frequency compensation, that compensation is applied at a later amplifier stage as a feed forward technique. The output signal 501a' of a buffer amplifier 510 is applied to a high frequency signal path comprising resistor R506 and to a low frequency signal path. The low frequency signal path comprises a variable gain amplifier 520 operating under control of a DAC 525, an R-C low pass filter including resistor R507 and capacitor C507, a buffer amplifier 540, and a series resistor R508. Signals from the high frequency and low frequency signal paths are summed at the junction of resistors R506 and R508 and applied to a further variable gain amplifier 530 operating under control of a DAC 535. In this design, the additional R-C time constant provided by R-C network R507, C507 is matched to the time constant of the input R-C voltage divider network R501, C501 and R502, C502. In this example R507 has a value of 9 kΩ and capacitor C507 has a value of 100 pf.

In operation, the gain of variable gain amplifier 520 determines whether the output signal of amplifier 540 appears more like waveform S501e, or more like waveform S501f. The output signal from DAC 525 controls variable gain amplifier 520 to properly shape the low frequency signal, such that when summed with the signal in the high frequency path, the resultant combined signal causes output amplifier 530 to produce a compensated waveform S501d at its output terminal. The apparatus of FIG. 5 has the following three advantages. First, it does not modify the input resistance. Second, because it operates on the low frequency components of the signal, variable gain amplifier 520 does not have to sink high frequency current. Third, this design reduces noise in the signal path because the output signal of variable gain amplifier 520 is low pass filtered by R-C network R507, C507.

Figure 6:
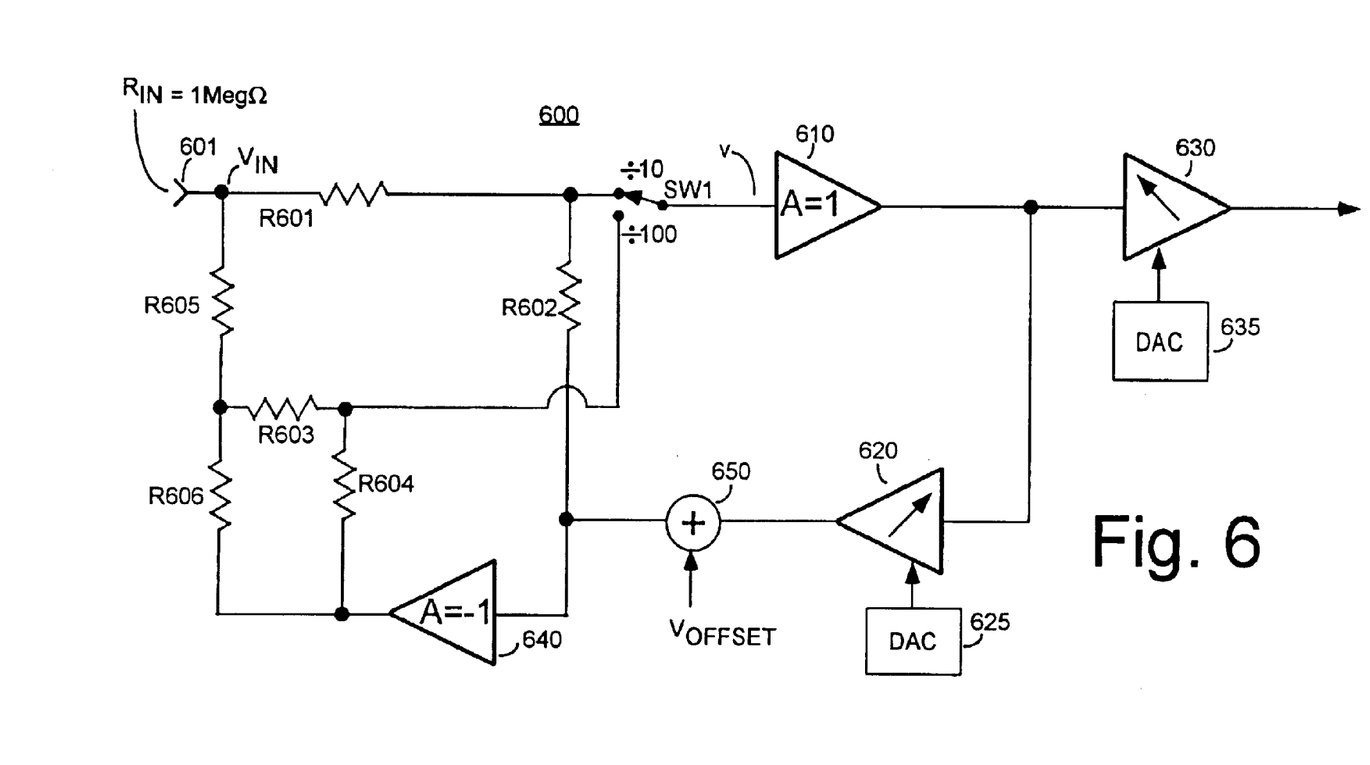
FIG. 6 shows, in simplified form, an attenuator circuit having adjustable compensation in accordance with the second embodiment of the subject invention of FIG. 4 and further including offset adjustment circuitry.

FIG. 6 is an illustration of a compensation arrangement for an attentuator in accordance with the subject invention, wherein the arrangement further includes offset adjustment circuitry. The topology of FIG. 6 is substantially the same as that of FIG. 4 with the exceptions that an Adder 650 has been included, and the capacitors are not shown for simplicity and ease of explanation, because an offset signal has only a DC value. All elements of FIG. 6 that have similar reference numbers to elements of FIG. 4 serve the same purpose and need not be described again. Referring to FIG. 6, note that Adder 650 is connected to receive, at a first terminal, the compensation signal from variable gain amplifier 620. Adder 650 adds a DC $V_{OFFSET}$ signal, received at a second terminal, to the compensation signal and applies the combined signal to resistor R602 and amplifier 640. The arrangement of FIG. 6 takes advantage of the technique shown in FIG. 4 of stabilizing the input resistance of the attenuator by applying an opposite resistance compensation, and extends the technique to adjust for offset in the input signal.

While the attenuator topology is discussed in terms of 10× and 100× attenuation ratios, one skilled in the art will readily understand that the teachings herein apply equally to other attenuation ratios. The effect of an offset signal on a 10× attenuator is discussed below with reference to FIG. 7, and the effect of an offset signal on a 100× attenuator is discussed with reference to FIG. 8.

Figure 7:
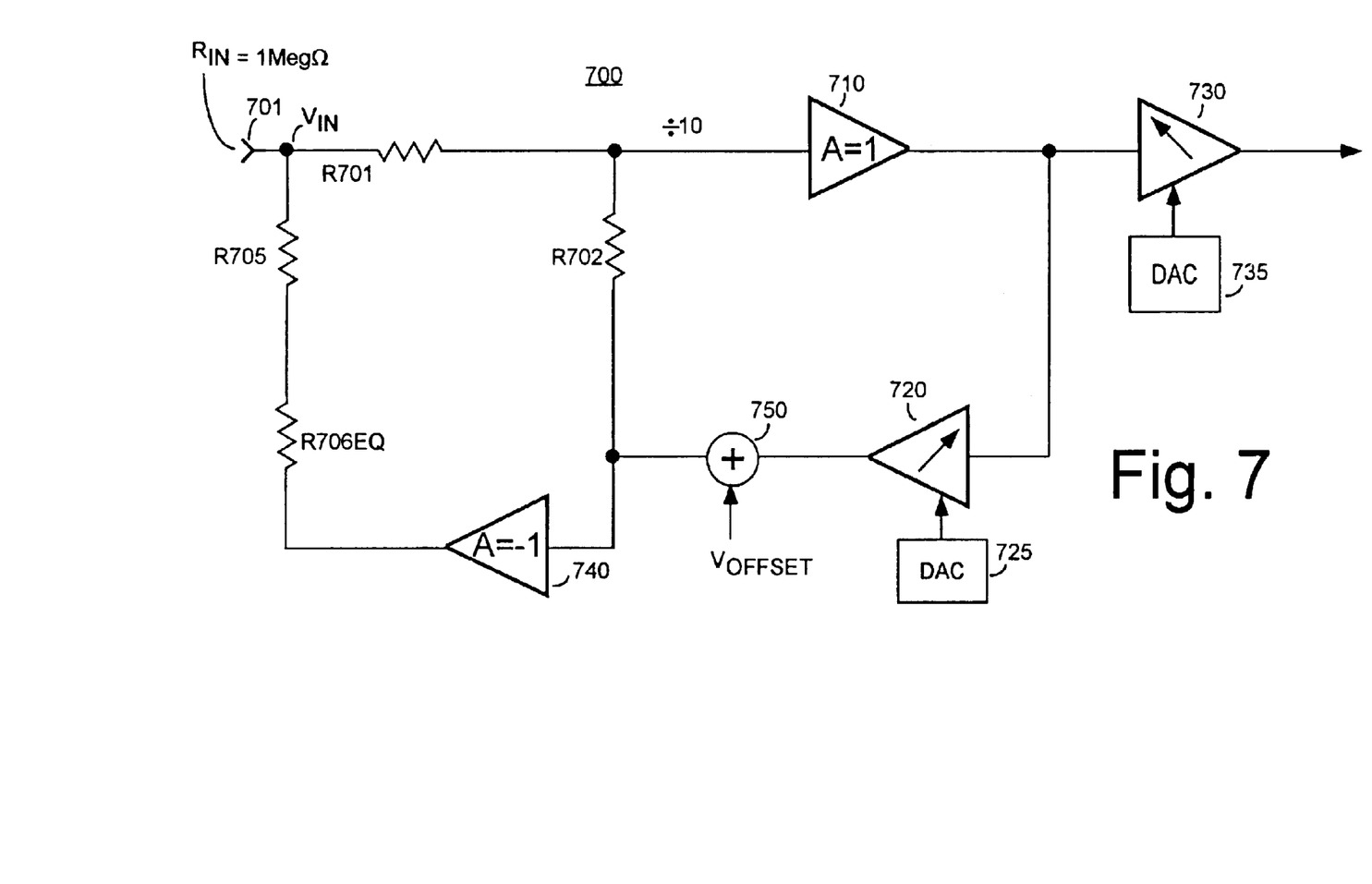
FIGS. 7 and 8 are further simplified illustrations useful in explaining the operation of the embodiment of FIG. 6.

The circuit of FIG. 7 is redrawn from FIG. 6 to put emphasis on the 10× attenuation path. In this regard, the selection switch SW1 and the 100× output path have been removed. Note also that resistors R603 (1.8 MΩ), R604 (200 kΩ), and R605 (222 kΩ) have been combined into their equivalent resistance R706EQ having a value of 200 kΩ

A voltage v is calculated in terms of the input voltage $V_{IN}$ and the adjustment voltage $V_{OFFSET}$. One can treat these voltages as being developed in independent voltage sources. We may use superposition to find the contribution of each source to the composite voltage v, with the other source set to zero. It should be noted that even if source $V_{IN}$ has a non-zero source resistance, changes in $V_{OFFSET}$ will not cause any changes in the voltage seen at the input node. That is, the input node is a virtual ground with respect to $V_{OFFSET}$.

For $V_{OFFSET}=0$ $$v=[(V_{IN}-Gv)k+Gv] \qquad \text{EQ1:}$$

$$v = \frac{kV_{IN}}{1-(1-k)G} \quad \text{EQ2:}$$

Where k is the inverse of the attenuation ratio (0.1 in this example); and G is the gain of variable gain amplifier 720. For $V_{IN}=0$ $$v=[(V_{OFFSET}+Gv)(1-k)] \quad \text{EQ3:}$$

$$v = \frac{(1-k)V_{OFFSET}}{1-(1-k)G} \quad \text{EQ4:}$$

Where k is the attenuation ratio (0.1 in this example); and G is the gain of variable gain amplifier 720.
Combining both expressions for v (i.e., EQ2 and EQ4) yields:

$$v = \frac{kV_{IN}+(1-k)V_{OFFSET}}{1-(1-k)G} \quad \text{EQ5:}$$

but, v=0 when:

$$kV_{IN}=-(1-k)V_{OFFSET} \quad \text{EQ6:}$$

solving for $V_{OFFSET}$ yields:

$$V_{OFFSET} = \frac{-kV_{IN}}{1-k} \quad \text{EQ7:}$$

Note that the expression of EQ7 is independent of G, the gain of variable gain amplifier 720. Thus, for the 10× attenuator (k=0.1):

$$V_{OFFSET} = \frac{-.1}{.9}V_{IN} \quad \text{EQ8:}$$

$$V_{OFFSET}=-0.11111111V_{IN} \quad \text{EQ9:}$$

Thus, a $V_{OFFSET}$ of −10 Volts can be used to correct an offset of 90 volts in a signal applied to input terminal 701 of 10× attenuator 700.

This is in contrast to typical offset ranges as known from the prior art. These offset ranges are designed into high speed buffer amplifiers and extend between ±1 volt. In such a system, the maximum voltage that could be offset at the input node to a 10× buffer amplifier using offset in the buffer amplifier would be ±10 volts.

Thus, by use of this aspect of the subject invention with an offset voltage source having a ±10 volt offset range, a nine-fold improvement in offset adjustment is achieved, while simultaneously relaxing design requirements in the dynamic range of the input buffer amplifier.

Figure 8:
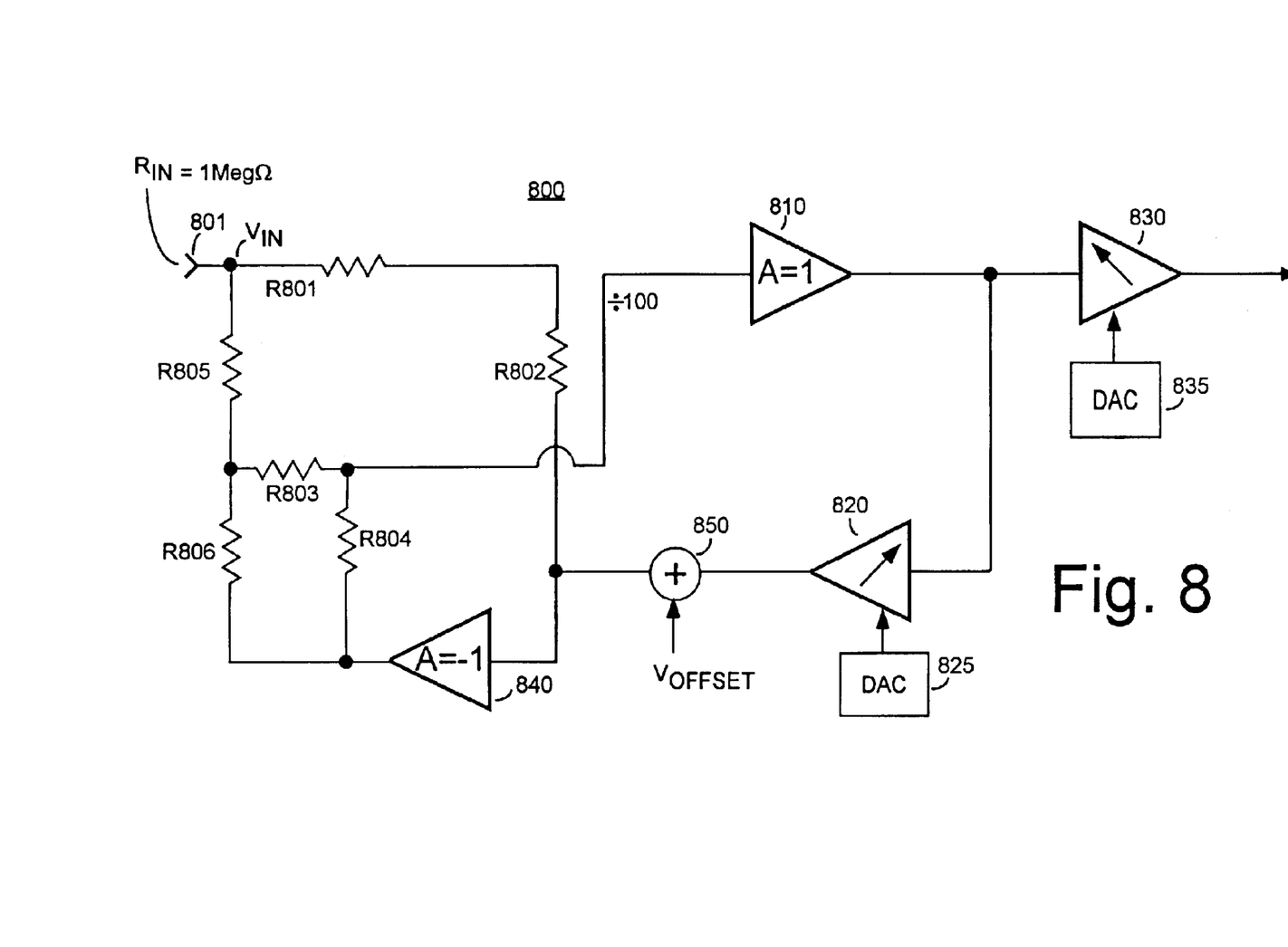

The circuit of FIG. 8 is redrawn from FIG. 6 to put emphasis on the 10× attenuation path. In this regard, the selection switch SW1 and the 10× output path have been removed. The analysis is substantially identical to that given above except for the polarity of $V_{OFFSET}$ due to the gain of −1 provided by amplifier 840, and all steps need not be shown again. Similar equation numbers in the analysis of FIG. 8, relate to the same point in the analysis given above with respect FIG. 7.

Where k is the attenuation ratio (0.01 in this example); and

G is the gain of variable gain amplifier 820.

$$v = \frac{kV_{IN}-(1-k)V_{OFFSET}}{1-(1-k)G} \quad \text{EQ5':}$$

but, v=0 when:

$$kV_{IN}=(1-k)V_{OFFSET} \quad \text{EQ6':}$$

solving for $V_{OFFSET}$ yields:

$$V_{OFFSET} = \frac{kV_{IN}}{1-k} \quad \text{EQ7':}$$

As above, the expression of EQ7' is independent of G, the gain of variable gain amplifier 820. Thus for the 100× attenuator (k=0.01):

$$V_{OFFSET} = \frac{.01}{.99}V_{IN} \quad \text{EQ8':}$$

$$V_{OFFSET}=0.00101001V_{IN} \quad \text{EQ9':}$$

Thus, a $V_{OFFSET}$ of 10 volts can be used to correct an offset of 990 volts in a signal applied to input terminal 801 of 100× attenuator 800.

Figure 9:
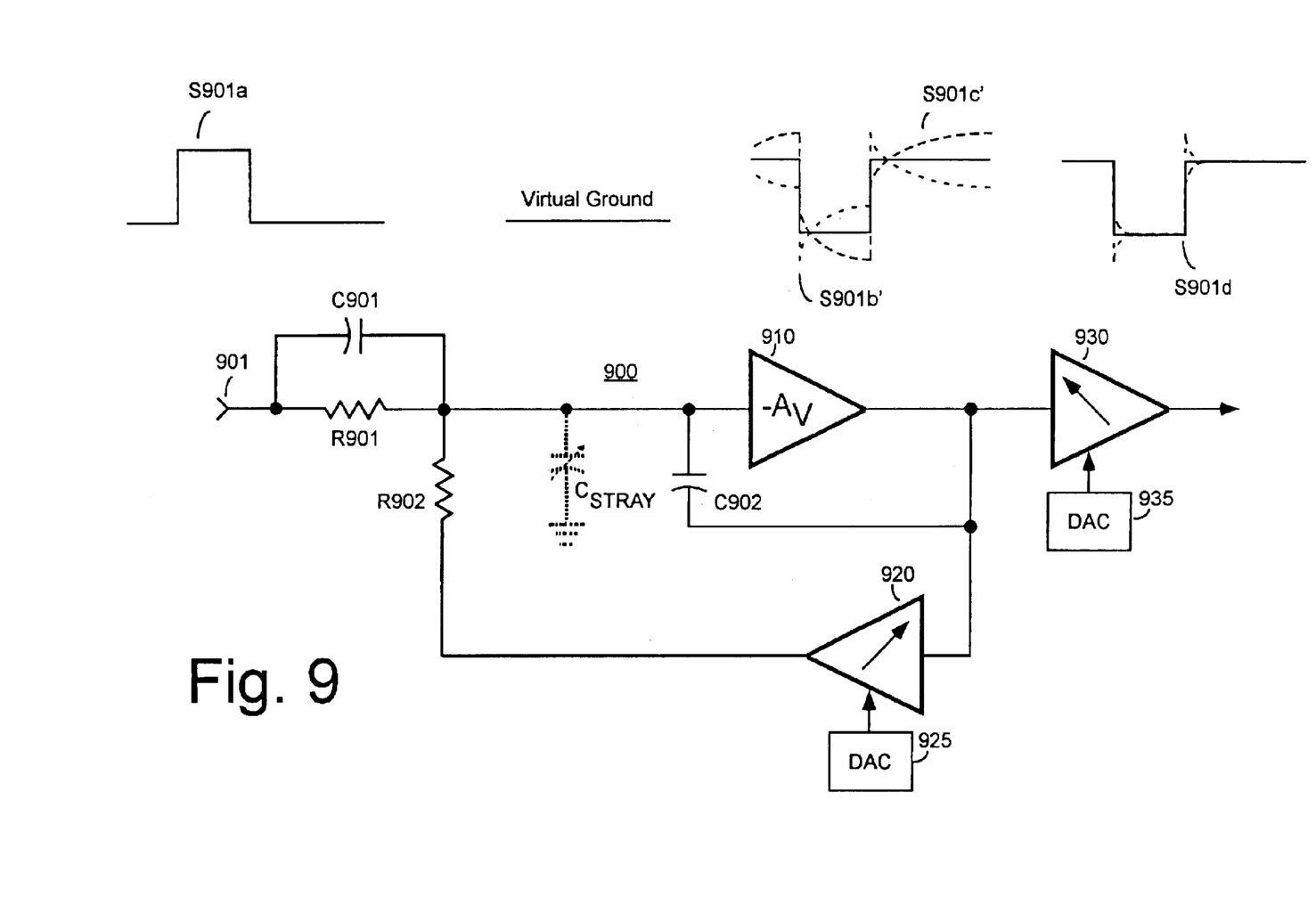
FIG. 9 is an illustration of an alternate embodiment of the arrangement of FIG. 3.

FIG. 9 shows an embodiment of the invention that is similar to that of FIG. 3, with the exception that capacitor 902 is returned to the output terminal of amplifier 910. Amplifier 910 exhibits a large negative gain, and the gain range of amplifier 920 is centered around a nominal gain of 1 instead of a nominal gain of 0. The elements of FIG. 9 bearing similar reference numerals to those of FIG. 3 serve the same purpose and need not be described again.

It is felt that the large negative gain of amplifier 910 with feedback makes its input appear to be a virtual ground. This virtual ground provides several benefits. First, the input resistance is simply that of resistor R901, and is not affected by changing the compensation. Second, no signal voltage appears across, and no signal current flows through, capacitance $C_{STRAY}$. Thus, compensation is needed only to correct for component value errors in resistors R901 and R902, and capacitors C901 and C902. Third, further attenuation ranges may be switched into place by using switches connected to the virtual ground, thereby allowing the use of switches having relatively high values of $C_{STRAY}$.

Figure 10:
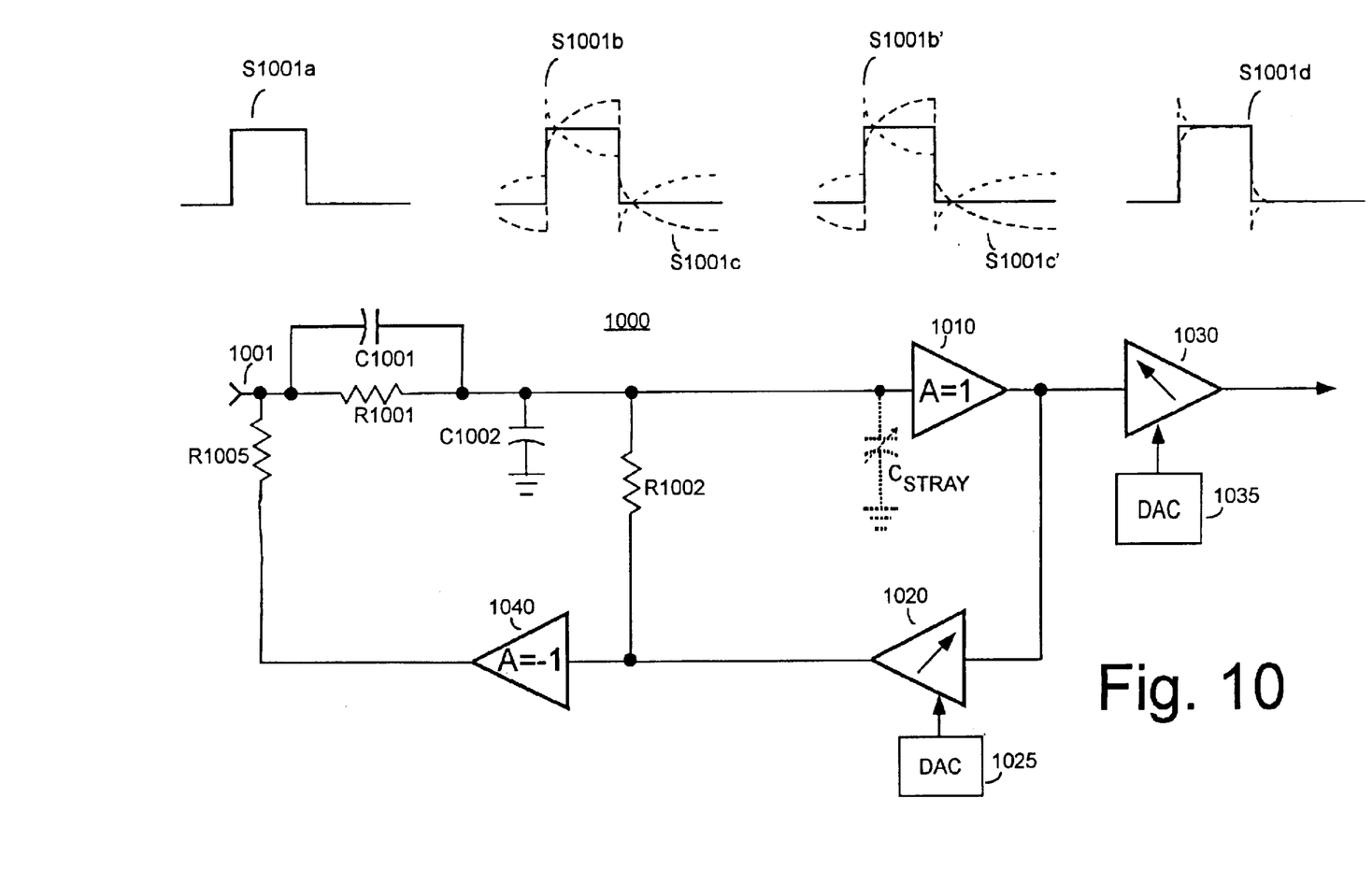
FIG. 10 is an illustration of an alternate embodiment of the arrangement of FIG. 4.

FIG. 10 is an embodiment of the invention that is similar to that of FIG. 4, except that switch SW1 is eliminated and resistor R1005 is substituted for the divide by 100 attenuator arrangement. In the apparatus of FIG. 10, resistors R1005 provides a path for the inverted compensation signal to be applied to input terminal 1001. Cancellation of the compensation signal and the inverted compensation signal at input terminal 1001 maintains a stable input resistance in the same manner as explained above.

What has been described is a method and apparatus for compensating a high frequency attenuator, wherein the low frequency components of the signal under test are adjusted to accomplish the compensation. An additional embodiment of the invention, including a method and apparatus for adjusting offset has also been described.

While the invention has been described with respect to attenuators used in test and measurement instruments such as oscilloscopes, logic analyzers, communications analyzers, spectrum analyzers, and the like, it is herein recognized that the invention is also applicable to attenuators employed in other fields of use. Use outside the test and measurement field of use, and inside the test and measurement field of use, are both deemed to lie within the scope of the following claims.

The following other modifications are considered to lie within the scope of the claims. For example, means other than a DAC may be used for controlling variable gain amplifier 320, 420, 520, 620, 720, 820, 920. A gain for amplifier 440, 640, 740, 840, 1040 of other than −1 (with a corresponding change in the ratio of the individual attenuator input resistances) still accomplishes $R_{IN}$ compensation. Circuitry with more than two attenuators is envisioned. A variable gain amplifier with a differential output may preferably be used rather than a variable gain amplifier followed by an amplifier having a gain of −1. An RL filter rather than an RC filter may be employed. A resistive divider from the variable gain amplifier output to ground may be used to reduce sensitivity to fixed errors in the output signal of the variable gain amplifier. Output variable gain amplifier 330 and DAC 335 could be replaced by "number crunching" circuitry.

What is claimed is:

1. An electronically adjustable attenuator, comprising:

an input terminal and an output terminal;

a resistive-capacitive voltage divider having at least a first capacitor coupled between said input and output terminals for conveying high frequency signals from said input terminal to said output terminal and at least a first resistor coupled in parallel with said at least first capacitor for conveying low frequency signals between said input terminal and said output terminal with said at least first capacitor and said at least first resistor having a common center tap coupled to at least a second capacitor coupled between said common center tap of said capacitor and resistor and a point of reference potential and at least a second resistor coupled to said common center tap;

a variable gain amplifier having an input terminal coupled to said common center tap of said at least first capacitor and resistor and having output terminal coupled to the other end of said at least second resistor for providing gain adjusted low frequency signals;

an inverting amplifier for receiving said gain adjusted low frequency signals, and generating an inverted representation of said gain adjusted low frequency signals at an output; and a resistive path coupled between said output of said inverting amplifier and said input terminal of said attenuator for conveying said inverted representation of said gain adjusted low frequency signals to said input terminal of said attenuator, wherein said attenuator is compensated by adjusting gain of said low frequency signals conveyed by said low frequency signal path.

2. The attenuator of claim 1, wherein:

said resistive path includes a resistive voltage divider having a center tap; and said attenuator further includes, a capacitive divider having a first end coupled to said input terminal of said attenuator, a center tap, and a second end couple to a point of reference potential, said center taps of said resistive divider and said capacitive divider being coupled together; and a selection circuit having a first input coupled to said common center tap of said at least first capacitor and resistor, a second input coupled to said center tap of said resistive divider, and an output selectively coupled to one of said common center tap of said at least first capacitor and resistor and said center tap of said resistive divider.

3. The attenuator of claim 1, further including:

offset circuitry for adding an offset signal to said gain adjusted low frequency signals and for adding an inverted representation of said offset signal to said inverted representation of said gain adjusted low frequency signals.

4. An electronically adjustable attenuator comprising:

an input terminal and an output terminal;

a high frequency signal path having a capacitive voltage divider coupled in parallel with a low frequency signal path having a resistive voltage divider;

said resistive and capacitive dividers have a first common input terminal coupled to said input terminal, a common center tap coupled to said output terminal for conveying high and low frequency signals from said input terminal to said output terminal, and a second common terminal coupled to a point of reference potential;

a lowpass filter for selecting low frequency signals; and a variable gain amplifier having an input terminal coupled to said common center tap and an output terminal coupled through said lowpass filter to said output terminal of said attenuator for providing said gain adjustment for said low frequency signals.

5. An electronically adjustable attenuator comprising:

an input terminal and an output terminal;

a high frequency signal path coupled between said input and output terminals for conveying high frequency signals from said input terminal to said output terminal;

a low frequency signal path coupled in parallel with said high frequency signal path for conveying low frequency signals between said input terminal and said output terminal;

a first amplifier; wherein said high frequency path comprises a capacitor disposed between said input terminal and an input of said first amplifier, and a feedback capacitor disposed between an output of said first amplifier and said input of said first amplifier;

said low frequency path comprises a resistor disposed between said input terminal and said input of said first amplifier, and a feedback resistor disposed between said output of said first amplifier and said input of said first amplifier; and a variable gain amplifier for adjusting low frequency gain, said variable gain amplifier being coupled within said low frequency path between said output of said first amplifier and said feedback resistor.

\* \* \* \* \*